(12) United States Patent
Maggi et al.

(10) Patent No.: US 6,861,860 B2
(45) Date of Patent: Mar. 1, 2005

(54) INTEGRATED CIRCUIT BURN-IN TEST SYSTEM AND ASSOCIATED METHODS

(75) Inventors: Riccardo Maggi, Camas, WA (US); Massimo Scipioni, Portland, OR (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/150,225

(22) Filed: May 17, 2002

(65) Prior Publication Data

US 2003/0214316 A1 Nov. 20, 2003

(51) Int. Cl.[7] .............................................. G01R 31/02
(52) U.S. Cl. ...................................... 324/760; 324/763
(58) Field of Search ............................ 324/760, 158.1, 324/765, 763; 219/209, 497, 492

(56) References Cited

U.S. PATENT DOCUMENTS

| | | | | |
|---|---|---|---|---|
| 5,309,090 A | * | 5/1994 | Lipp ........................ | 324/158.1 |
| 6,060,895 A | | 5/2000 | Soh et al. .................... | 324/760 |
| 6,329,642 B1 | * | 12/2001 | Kaneko et al. ............. | 219/497 |
| 6,433,567 B1 | * | 8/2002 | Okayasu ..................... | 324/760 |
| 6,437,590 B1 | * | 8/2002 | Tatsumi ...................... | 324/763 |
| 6,552,560 B2 | * | 4/2003 | Melgaard et al. ........... | 324/760 |
| 6,636,062 B2 | * | 10/2003 | Gaasch et al. .............. | 324/760 |

* cited by examiner

Primary Examiner—Evan Pert
Assistant Examiner—Tung X. Nguyen
(74) Attorney, Agent, or Firm—Lisa K. Jorgenson; Christopher F. Regan

(57) ABSTRACT

An integrated circuit burn-in test system includes an integrated circuit and a tester. The integrated circuit includes operating circuitry, a heater for heating the operating circuitry, and burn-in test circuitry for testing the operating circuitry while being heated. A package surrounds the operating circuitry, the heater and the burn-in test circuitry. The burn-in test circuitry causes the operating circuitry to operate and generate data related thereto. The tester receives data from the burn-in test circuitry. The heater may be configured within the package to heat at least one predetermined portion of the operating circuitry.

30 Claims, 4 Drawing Sheets

INTEGRATED CIRCUIT BURN-IN TEST SYSTEM AND ASSOCIATED METHODS

FIELD OF THE INVENTION

The present invention relates to the field of test systems for integrated circuits, and more particularly, to a test system for performing burn-in testing of a packaged integrated circuit.

BACKGROUND OF THE INVENTION

To estimate the operable life of integrated circuits, they undergo burn-in testing. During burn-in testing, excess stresses are applied to the integrated circuits in an operating environment that is worse than the expected normal operating environment. This type of testing accelerates aging of the integrated circuits to determine to a reasonable certainty whether the integrated circuits will perform as expected for their anticipated life.

Burn-in testing may be performed at the wafer-level, i.e., before the integrated circuits are packaged. U.S. Pat. No. 6,060,895 to Soh et al. discloses a wafer-level dielectric testing structure that includes a heating element that is part of the integrated circuit being tested. The heating element is formed as a layer above a tunnel oxide layer of the integrated circuit. The heating element helps to accelerate endurance testing. However, the testing is conducted before the integrated circuit is packaged.

Burn-in testing may also be performed at the package-level, i.e., after the integrated circuits are packaged. The packaged integrated circuits are placed on burn-in test boards, each of which includes burn-in test circuits and pads for receiving various types of test voltages. The burn-in test circuits include burn-in instructions for operating the integrated circuits and for collecting and evaluating data therefrom. The burn-in test boards and the packaged integrated circuits are then placed in a burn-in chamber.

Burn-in testing is conducted at elevated temperatures within the burn-in chamber for specified periods of time in a way that exposes "infant mortality failures." The integrated circuits that fail as a result of fabrication variation, and those that fail early in the test procedure, indicate a much earlier than expected failure if used under actual operating conditions. Burn-in testing can also be used to expose integrated circuits that do not apparently have fabrication flaws, but nevertheless, would fail at unexpectedly early times in their service lives.

Burn-in testing of integrated circuits in a burn-in chamber is a slow and expensive process. Large burn-in chambers are required to accommodate multiple burn-in test boards. There is also a limited throughput of the burn-in chambers, and a limited amount of integrated circuits can be mounted on the burn-in test boards.

Another drawback of testing integrated circuits in a burn-in chamber is that all the circuits and components within the burn-in chamber are stressed by the high temperatures. This causes the burn-in boards to degrade over time, for example. Moreover, the entire packaged integrated circuits are stressed even though selected areas thereof may actually be tested. For example, U.S. Pat. No. 5,309,090 to Lipp discloses a packaged integrated circuit including heating means, along with sensing and control means, for heating the integrated circuit to a desired temperature for purposes of burn-in testing. However, all of the integrated circuit is heated.

SUMMARY OF THE INVENTION

In view of the foregoing background, it is therefore an object of the present invention to perform burn-in testing of an integrated circuit in a more efficient manner.

This and other objects, advantages and features according to the present invention are provided by an integrated circuit burn-in test system comprising an integrated circuit and a tester therefor. The integrated circuit comprises operating circuitry, a heater for heating the operating circuitry, and burn-in test circuitry for testing the operating circuitry while being heated. A package surrounds the operating circuitry, the heater and the burn-in test circuitry. The tester receives data from the burn-in test circuitry.

The operating circuitry being tested is advantageously heated via the heater included within the packaged integrated circuit. As noted above, testing in a burn-in chamber is a slow and expensive process, and there is a limited throughput of the burn-in chambers since a limited amount of integrated circuits can be placed therein. The present invention thus avoids having to use a burn-in chamber to heat the operating circuitry being tested.

The burn-in test circuitry causes the operating circuitry to operate and generate data related thereto. The burn-in test circuitry preferably includes a set of burn-in instructions, which are typically a specialized set of instructions for the operating circuitry. In addition to the burn-in test circuitry operating the operating circuitry and generating data related thereto, the burn-in test circuitry may store the generated data. The burn-in test circuitry may also process the stored generated data for receipt by the tester.

The tester may include a processor that runs a set of evaluation instructions for evaluating the collected data. This evaluation may be performed while the data is being collected, or may be performed after the data has been collected. If the evaluation is performed after the data has been collected by the burn-in test circuitry, then the tester does not need to be connected to the integrated circuit while the operating circuitry is being tested. Depending on the level of processing performed by the burn-in circuitry on the generated data, the tester may advantageously be a relatively straightforward device.

The heater may be configured within the package to heat the entire operating circuitry, or to heat at least one predetermined portion of the circuitry. By heating only a predetermined portion of the operating circuitry, the unheated portion is not subjected to the stresses normally associated with high temperatures. The integrated circuit may further comprise a temperature sensor associated with the operating circuitry.

In one embodiment, the heater comprises an electrical heater powered by a current generator. The current generator may be included in the tester, or alternately, may be included within the integrated circuit itself. In another embodiment, the heater comprises a thermally conductive body and at least one thermally conductive member connected thereto and exposed through the package. The thermally conductive member includes at least one metal pin extending outwardly from the package for interfacing with an external heat source.

In lieu of the burn-in instructions being provided by the burn-in circuitry, the instructions may be provided by the tester. In other words, the operating circuitry being tested is externally controlled.

The operating circuitry may be memory circuitry, such as a DRAM, for example. The burn-in instructions, for example, read from and write to the memory circuitry during the burn-in testing. The burn-in instructions may include heating the circuitry without operating the circuitry, performing a functional test of the circuitry while being heated, and operating the circuitry in a normal operating mode while being heated.

Another aspect of the present invention is directed to a method for performing burn-in testing of an integrated circuit. The method preferably comprises providing an integrated circuit comprising operating circuitry, a heater for heating the operating circuitry, and burn-in test circuitry for testing the operating circuitry while being heated. The integrated circuit includes a package surrounding the operating circuitry, the heater and the burn-in test circuitry. The method further comprises activating the burn-in test circuitry, and receiving data from the burn-in test circuitry.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime and multiple prime notations are used in alternate embodiments.

Figure 1:
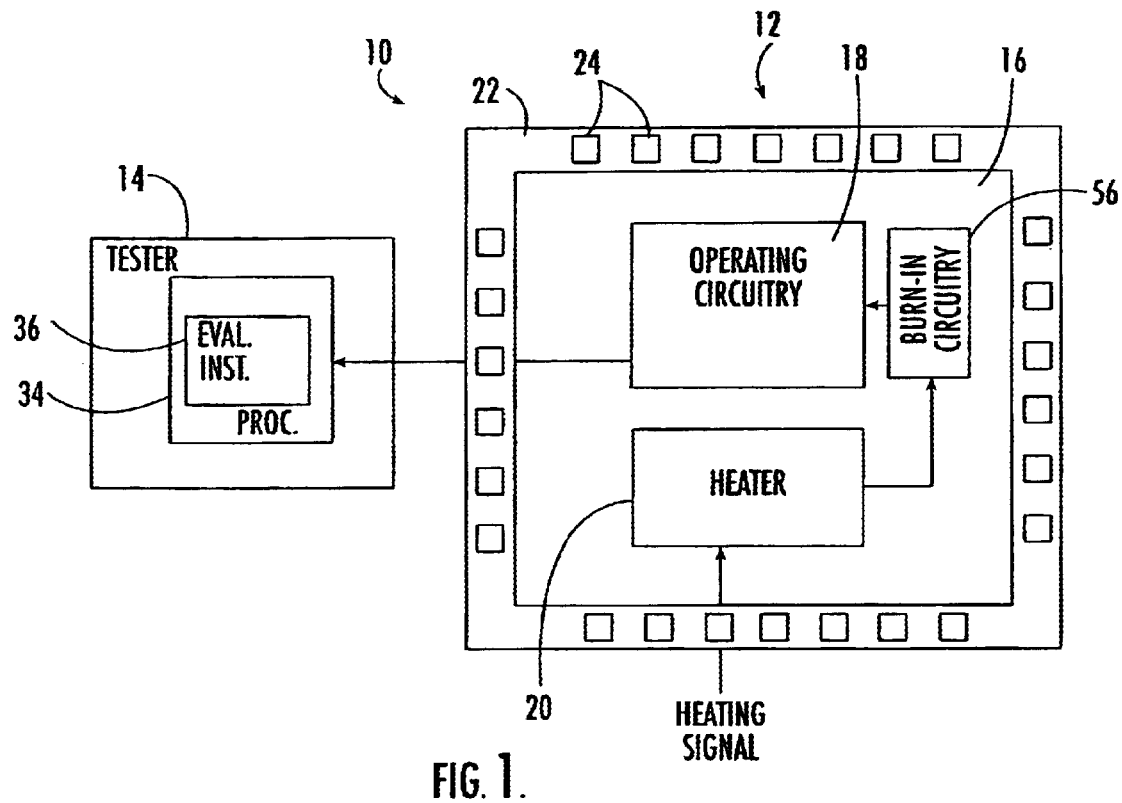
FIG. 1 is a block diagram of an integrated circuit burn-in test system including burn-in circuitry in accordance with the present invention.
Figure 2:
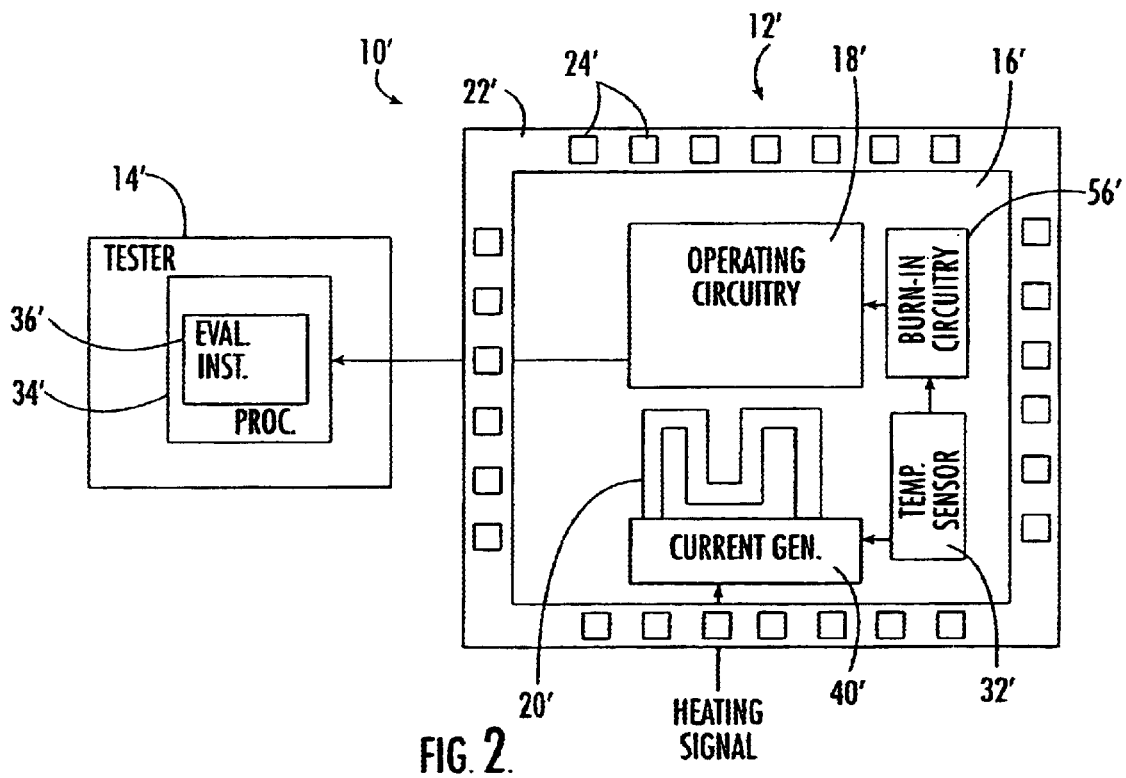
FIG. 2 is a more detailed block diagram of the integrated circuit burn-in test system illustrated in FIG. 1 utilizing an electrical heater.
Figure 3:
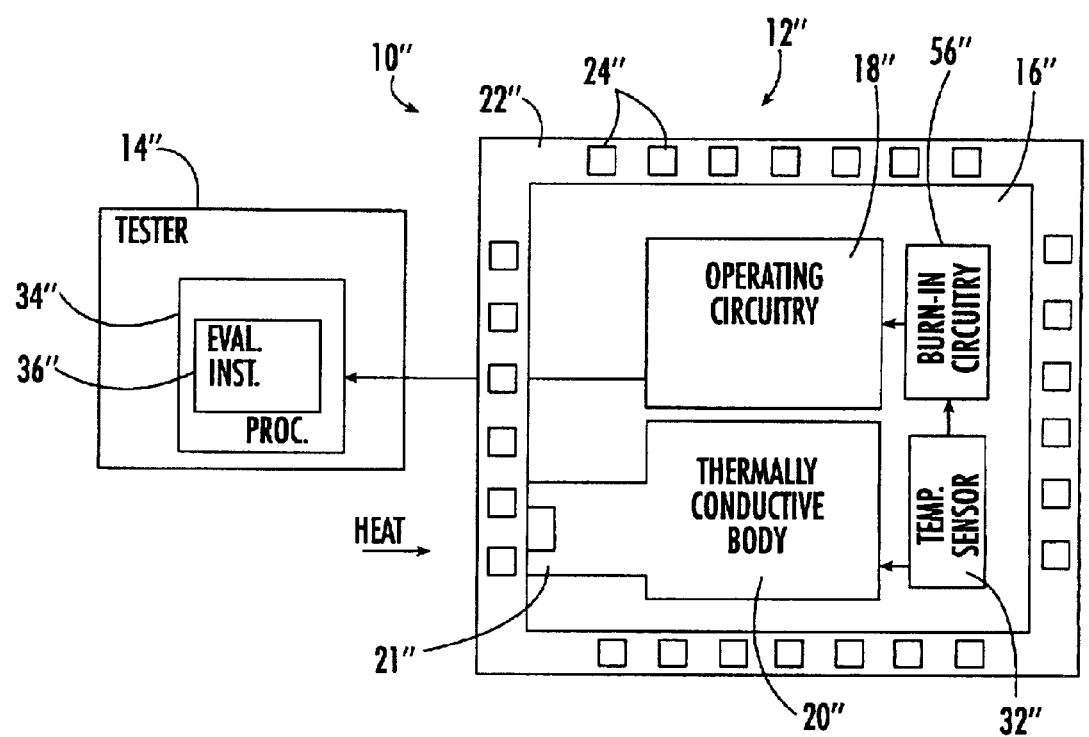
FIG. 3 is a more detailed block diagram of the integrated circuit burn-in test system illustrated in FIG. 1 utilizing a thermally conductive body as the heater.

Referring initially to FIGS. 1–3, an integrated circuit burn-in test system 10 in accordance with the present invention will be described. The test system 10 includes an integrated circuit 12 and a tester 14 therefor. The integrated circuit 12 includes operating circuitry 18, a heater 20 for heating the operating circuitry, and burn-in test circuitry 56 for testing the operating circuitry while being heated. A package 22 surrounds the operating circuitry 18, the heater 20 and the burn-in test circuitry 56.

The integrated circuit 12 includes a semiconductor substrate 16 in which the operating circuitry 18 and the burn-in test circuitry 56 are formed. The heater 20 may also be formed in the semiconductor substrate 16. The package 22 comprises a body of dielectric material, and pins or contact pads 24 are positioned around the substrate 16 for interfacing through the package 22.

In accordance with the present invention, burn-in testing of the operating circuitry 18 is performed after it has been packaged. Burn-in testing is thus performed at the package-level. This is in contrast to performing burn-in testing at the wafer-level, that is, after the operating circuitry 18 has been separated from a wafer that includes other circuitry formed therein, but before the circuitry is packaged. An advantage of performing burn-in testing at the package-level is that burn-in testing is performed in a more efficient manner, particularly since a burn-in chamber is not required. This allows normal integrated circuit processing steps to be used without requiring additional processing steps supporting a wafer-level burn-in.

The burn-in test circuitry 56 causes the operating circuitry 18 to operate and generate data related thereto. The burn-in test circuitry 56 includes a set of burn-in instructions, which are typically a specialized set of instructions for the operating circuitry 18. For purposes of illustrating the present invention, the operating circuitry 18 is memory circuitry, such as a DRAM, for example, and the burn-in test circuitry 56 continuously performs read and write commands to the memory cells therein.

In addition to the burn-in test circuitry 56 operating the operating circuitry 18 and generating data related thereto, the burn-in test circuitry stores the generated data. The burn-in test circuitry 56 may include an internal memory, for example, for storing the generated data. Alternately, the generated data may be stored in a memory separate from the burn-in test circuitry 56. The burn-in test circuitry 56 may also process the stored generated data for receipt by the tester 14.

The burn-in test circuitry 56 may also cause the operating circuitry 18 to perform in a normal manner, but at an elevated temperature. The tester 14 includes a processor 34 that runs a set of evaluation instructions 36 for evaluating the collected data. This evaluation may be performed while the data is being collected, or may be performed after the data has been collected. If the evaluation is performed after the data has been collected by the burn-in test circuitry 56, then the tester 14 does not need to be connected to the integrated circuit 12 while the operating circuitry 18 is being tested.

The burn-in test circuitry 56 tests the operating circuitry 18 while the heater 20 heats the operating circuitry to a desired temperature. As readily understood by one skilled in the art, burn-in testing involves operating the operating circuitry 18 at an elevated temperature, which is a temperature higher than a nominal operating temperature of the circuitry.

The heater 20 heats the operating circuitry 18 to a temperature in a range of about an ambient nominal operating temperature and 150° C. However, a burn-in temperature range is typically between about 90 to 130° C. The temperature may be varied within these ranges based upon the desired thermal cycles that the operating circuitry 18 is to experience. These temperature values are for illustrative purposes only, and the actual temperature range may exceed 190° C., as readily appreciated by one skilled in the art. After burn-in testing of the operating circuitry 18 has been completed, the heater 20 is not used during normal operation of the operating circuitry.

The heater 20 may operate, for example, for less than 15 minutes to about 48 hours. Of course, the actual length of time the heater 20 heats the operating circuitry 18 is based upon the desired tests to be performed, and may actually exceed 48 hours. For example, selected tests may last weeks or even months. For example, burn-in testing may include reliability and qualification type testing, which covers a broad range in terms of temperature and testing durations, as readily appreciated by one skilled in the art.

The heater 20 may be an electrical heater 20' as illustrated in FIG. 2, or a thermally conductive body 20" as illustrated in FIG. 3. Each of these embodiments will now be discussed in greater detail. Placement of the heater 20', 20" may be directly on or under the operating circuitry 18', 18" or adjacent the operating circuitry. In addition, the heater 20', 20" may also be positioned to heat at least one predetermined portion of the circuitry 18', 18", as will be described in greater detail with reference to FIGS. 4 and 5.

The electrical heater 20' includes an electrical resistance heater, and a current generator 40' connected thereto. The electrical heater 20' may be an electrical resistance heater comprising a metal or diffused resistor, for example. An externally generated heating signal causes the current generator 40' to generate a current for causing the electrical resistance heater 20' to heat. The heating signal may be delivered by the tester 14, for example. The integrated circuit 12' further includes a temperature sensor 32' associated with the operating circuitry 18'. The current generator 40' cooperates with the temperature sensor 32' to control a temperature of the operating circuitry 18' to a desired temperature.

When the heating element 20 is a thermally conductive body 20", at least one thermally conductive member 21" is connected thereto. The at least one thermally conductive member 21" is exposed through the package 22". The thermally conductive body 21" has a higher thermal conductivity than the package 22". An external heat source connects to the exposed thermally conductive member 21" for providing heat thereto. The temperature sensor 32" cooperates with the external heat source to control a temperature of the operating circuitry 18" to a desired temperature.

Figure 4:
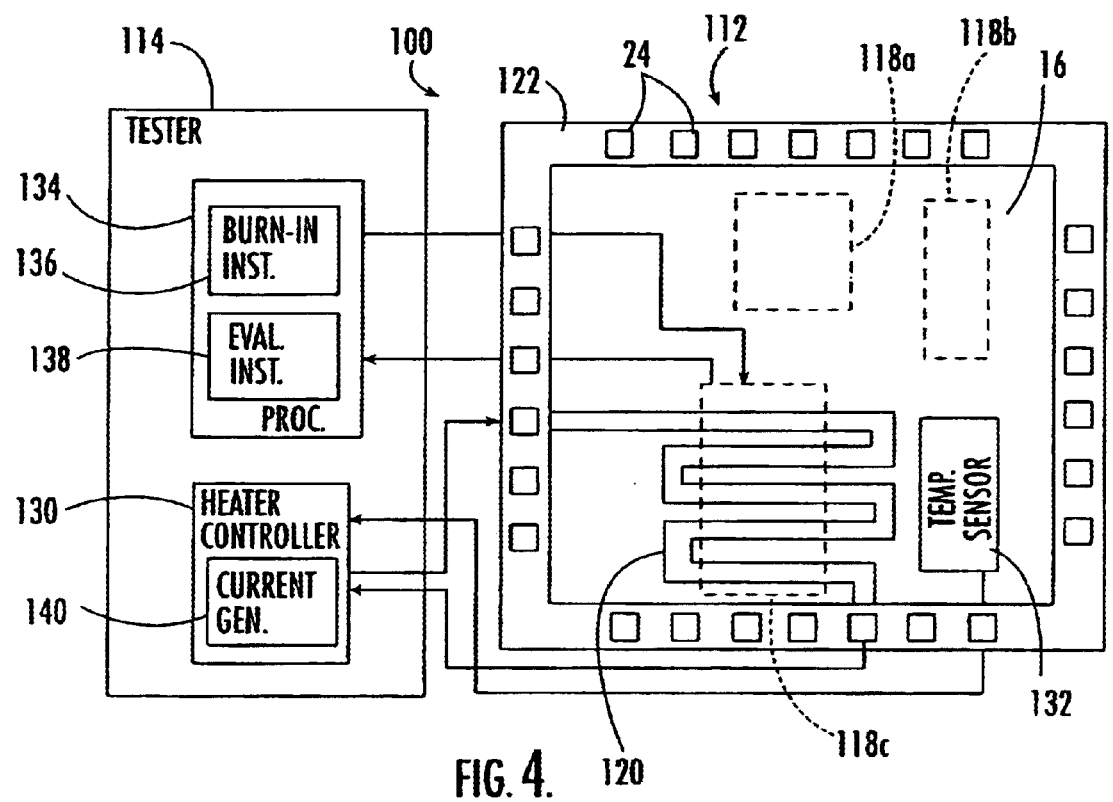
FIG. 4 is a block diagram of another embodiment of the integrated circuit burn-in test system utilizing an electrical heater for heating a first portion of the operating circuitry in accordance with the present invention.

Referring now to FIG. 4, an alternative embodiment of the test system 100 will be discussed. In this embodiment, the integrated circuit 112 comprises operating circuitry comprising a plurality of portions 118a–118c. A heater 120 is adjacent at least one first portion 118c of the operating circuitry for selectively heating the at least one first portion during burn-in testing. The heater 120 is spaced from at least one second portion 118a, 118b of the operating circuitry. A package 122 surrounds the operating circuitry 118a–118c and the heater 120.

Heating at least one predetermined portion 118c of the operating circuitry advantageously allows the elevated temperature to be localized within the package 122. Instead of heating the entire operating circuitry 118a–118c, a predetermined portion of the circuitry is thus heated.

The burn-in instructions for testing the operating circuitry 118c while being heated may be included within the integrated circuit 112 as illustrated above, or they are included in the tester 114, as illustrated in FIG. 4. In this embodiment, the tester 114 includes a processor 134 including a set of instructions 136 for burn-in testing the operating circuitry 118c, and instructions 138 for collecting and evaluating data obtained from the operating circuitry 118c being tested.

The test circuit 114 also includes a heat controller 130 for controlling the heater, which is an electrical resistance heater 120. The heater controller 130 also includes a current generator 140 that is selectively coupled to the electrical resistance heater 120. The current generator 140 cooperates with a temperature sensor 132 within the integrated circuit 112.

Figure 5:
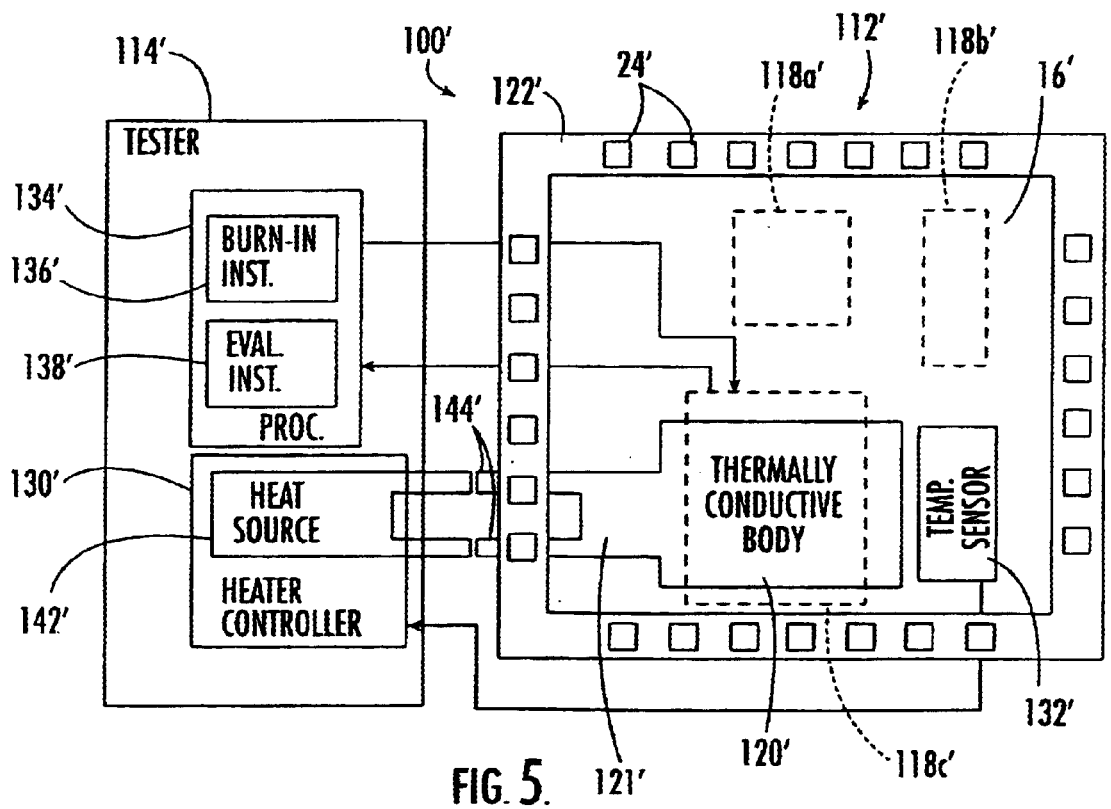
FIG. 5 is a block diagram of another embodiment of an integrated circuit burn-in test system utilizing a thermally conductive body as the heater for heating a first portion of the operating circuitry in accordance with the present invention.
Figure 6:
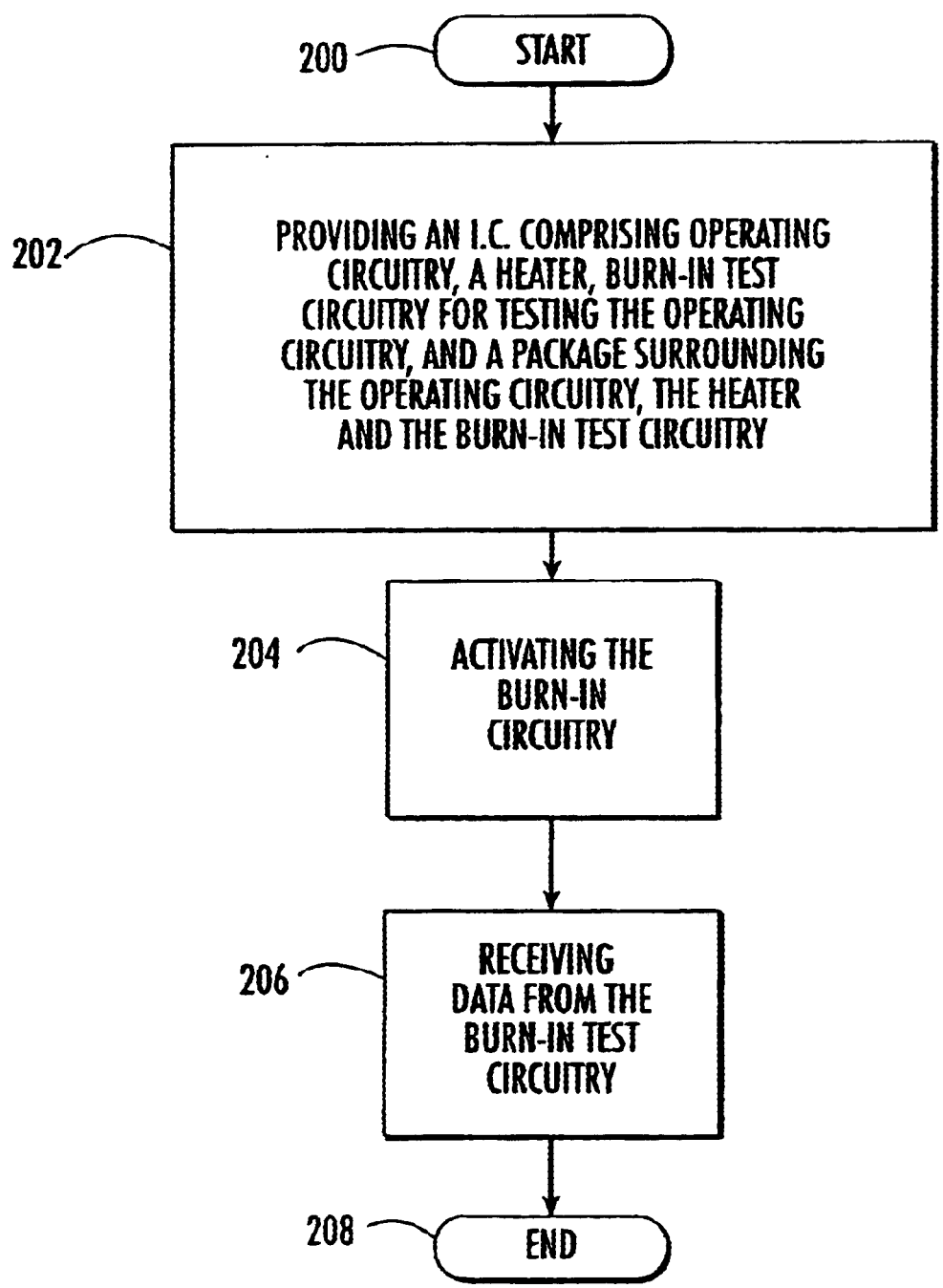
FIG. 6 is a flowchart illustrating a method for performing burn-in testing of an integrated circuit in accordance with the present invention.

When the heater is a thermally conductive body 120', as illustrated in FIG. 5, the heater controller 130' in the tester 114' includes a heat source 142' to be selectively thermally coupled to the thermally conductive body. At least one thermally conductive member 121' is connected to the thermally conductive body 120' and exposed through the package 122'. The thermally conductive member 121' includes at least one metal pin 144' extending outwardly from the package 122' for interfacing with the external heat source 142'. Even though the burn-in instructions are stored within the tester 114' in this illustrated embodiment, they may be stored within the integrated circuit 112' as illustrated above.

Another aspect of the present invention is directed to a method for performing burn-in testing of an integrated circuit 12. From the start (Block 200), the method includes providing at Block 202 an integrated circuit 12 comprising operating circuitry 18, a heater 20 for heating the operating circuitry, burn-in test circuitry 56 for testing the operating circuitry while being heated. A package 22 surrounds the operating circuitry 18, the heater 20 and the burn-in test circuitry 56. The method further includes activating the burn-in test circuitry 56 at Block 204, and receiving data from the burn-in test circuitry at Block 206. The method is completed at Block 208.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit burn-in test system comprising:
    an integrated circuit comprising
        operating circuitry,
        a heater for heating said operating circuitry,
        burn-in test circuitry for causing said operating circuitry to operate and generate data related thereto while being heated, and
        a package surrounding said operating circuitry, said heater and said burn-in test circuitry; and
    a tester for receiving data from said burn-in test circuitry.

2. A test system according to claim 1 wherein said burn-in test circuitry stores the generated data.

3. A test system according to claim 2 wherein said burn-in test circuitry processes the stored generated data for receipt by said tester.

4. A test system according to claim 1 wherein said heater is configured within said package to heat at least one predetermined portion of said operating circuitry.

5. A test system according to claim 1 wherein said heater comprises an electrical heater.

6. A test system according to claim 5 wherein said electrical heater comprises an electrical resistance heater, and a current generator connected thereto.

7. A test system according to claim 1 wherein said operating circuitry comprises memory circuitry.

8. A test system according to claim 1 wherein said heater heats said operating circuitry to a temperature in a range of about an ambient nominal operating temperature and 150° C.

9. A test system according to claim 1 wherein said heater heats said operating circuitry for a time within a range of about 15 minutes to 48 hours.

10. A test system according to claim 1 wherein said heater is used only for burn-in testing.

11. A test system according to claim 1 wherein said integrated circuit comprises a semiconductor substrate in which said operating circuitry and burn-in test circuitry are formed.

12. A test system according to claim 11 wherein said heater is formed in said semiconductor substrate.

13. A test system according to claim 1 wherein said package comprises a body of dielectric material.

14. An integrated circuit for burn-in testing comprising:
    operating circuitry;
    a heater for heating said operating circuitry;
    burn-in test circuitry for causing said operating circuitry to operate and generate data related thereto while being heated; and
    a package surrounding said operating circuitry, said heater and said burn-in test circuitry.

15. An integrated circuit according to claim 14 wherein said burn-in test circuitry stores the generated data.

16. An integrated circuit according to claim 15 wherein said burn-in test circuitry processes the stored generated data.

17. An integrated circuit according to claim 14 wherein said heater is configured within said package to heat at least one predetermined portion of said operating circuitry.

18. An integrated circuit according to claim 14 wherein said heater comprises an electrical resistance heater, and a current generator connected thereto.

19. An integrated circuit according to claim 14 further comprising a temperature sensor associated with said operating circuitry.

20. An integrated circuit according to claim 14 wherein said operating circuitry comprises memory circuitry.

21. An integrated circuit according to claim 14 wherein said heater is used only for burn-in testing.

22. An integrated circuit according to claim 14 further comprising a semiconductor substrate in which said operating circuitry, said burn-in test circuitry, and said heater are formed.

23. A method for burn-in testing of an integrated circuit comprising:
    providing an integrated circuit comprising operating circuitry a heater for heating the operating circuitry, burn-in test circuitry for testing the operating circuitry while being heated, and a package surrounding the operating circuitry, the heater and the burn-in test circuitry;
    activating the burn-in test circuitry for causing the operating circuitry to operate and generate data related thereto; and
    receiving the generated burn-in test data from the burn-in test circuitry.

24. A method according to claim 23 further comprising storing the generated data in the burn-in test circuitry.

25. A method according to claim 24 further comprising processing the stored generated data in the burn-in test circuitry.

26. A method according to claim 23 wherein the heater is configured within the package to heat at least one predetermined portion of the operating circuitry.

27. A method according to claim 23 wherein the heater comprises an electrical heater.

28. A method according to claim 23 wherein the integrated circuit further comprises a temperature sensor associated with the operating circuitry.

29. A method according to claim 23 wherein the operating circuitry comprises memory circuitry.

30. A method according to claim 23 wherein the heater is used only for burn-in testing.

* * * * *